United States Patent
Ji

(10) Patent No.: US 12,301,237 B2
(45) Date of Patent: *May 13, 2025

(54) VOLTAGE CONVERSION CIRCUIT AND MEMORY

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

This patent is subject to a terminal disclaimer.

(21) Appl. No.: 18/157,155

(22) Filed: Jan. 20, 2023

(65) Prior Publication Data

US 2023/0170885 A1    Jun. 1, 2023

Related U.S. Application Data

(63) Continuation of application No. PCT/CN2022/092546, filed on May 12, 2022.

(30) Foreign Application Priority Data

Jul. 16, 2021 (CN) .......................... 202110808613.8

(51) Int. Cl.
| | |
|---|---|
| *G11C 5/14* | (2006.01) |
| *G11C 7/10* | (2006.01) |
| *H03K 3/037* | (2006.01) |
| *H03K 19/0185* | (2006.01) |

(52) U.S. Cl.
CPC .............. *H03K 3/037* (2013.01); *G11C 7/10* (2013.01); *H03K 19/018521* (2013.01)

(58) Field of Classification Search
CPC ... H03K 3/037; H03K 19/018521; G11C 7/10
See application file for complete search history.

(56) References Cited

U.S. PATENT DOCUMENTS

| | | | | |
|---|---|---|---|---|
| 10,115,450 | B1 * | 10/2018 | DeBrosse | ........ H03K 3/356182 |
| 11,863,179 | B2 * | 1/2024 | Ji | ............................ H03K 3/037 |
| 2003/0076149 | A1 | 4/2003 | Haga | |
| 2004/0150607 | A1 | 8/2004 | Nakajima | |
| 2005/0206432 | A1 * | 9/2005 | Tobita | ...................... G09G 3/20 |
| | | | | 327/333 |

FOREIGN PATENT DOCUMENTS

| | | |
|---|---|---|
| CN | 1295875 C | 1/2007 |
| CN | 103532526 A | 1/2014 |
| CN | 103325419 B | 5/2017 |
| CN | 108649939 A | 10/2018 |
| CN | 111342834 A | 6/2020 |
| CN | 112671391 A | 4/2021 |

* cited by examiner

*Primary Examiner* — Min Huang
(74) *Attorney, Agent, or Firm* — Syncoda LLC; Feng Ma

(57) ABSTRACT

A voltage conversion circuit and a memory are provided. The voltage conversion circuit includes a driving circuit and a receiving circuit. The driving circuit is powered by a first voltage, and outputs a first signal at an output end, a voltage of a high level of the first signal being less than the first voltage. The receiving circuit is powered by the first voltage, receives the first signal at a first input end, and receives a sampling signal at a second input end. The receiving circuit is configured to output a second signal according to the sampling signal, and a voltage of a high level of the second signal is equal to the first voltage.

18 Claims, 14 Drawing Sheets

VOLTAGE CONVERSION CIRCUIT AND MEMORY

CROSS-REFERENCE TO RELATED APPLICATION

This is a continuation of International Patent Application No. PCT/CN2022/092546 filed on May 12, 2022, which claims priority to Chinese Patent Application No. 202110808613.8 filed on Jul. 16, 2021. The disclosure of these applications is incorporated by reference in their entirety.

BACKGROUND

In some application scenarios of the memory, it is necessary to introduce a level conversion unit to convert a signal with a smaller level value into a signal with a higher level value, or to convert a signal with the higher level value into a signal with the smaller level value. With the increasing requirements of the memory for power consumption, speed and area, the existing level conversion circuits need to constantly optimize the power consumption, speed and area.

In view of this, there is a need for a voltage conversion circuit that can give consideration to low power consumption and small element occupation area.

It should be noted that the information disclosed in the above background section is only for enhancement of understanding of the background of the present disclosure and therefore may include information that does not constitute related art known to those skilled in the art.

SUMMARY

The present disclosure relates to the field of integrated circuits. The purpose of the present disclosure is to provide a voltage conversion circuit and a memory to which the voltage conversion circuit is applied in order to overcome, at least to a certain extent, limitations and defects of the related art.

According to a first aspect of the present disclosure, there is provided a voltage conversion circuit, which includes a driving circuit and a receiving circuit. The driving circuit is powered by a first voltage, outputs a first signal at an output end, and a voltage of a high level of the first signal is less than the first voltage. The receiving circuit is powered by the first voltage, receives the first signal at a first input end, and receives a sampling signal at a second input end. The receiving circuit is configured to output a second signal according to the sampling signal, and a voltage of a high level of the second signal is equal to the first voltage.

According to a second aspect of the present disclosure, there is provided a memory including the voltage conversion circuit as described in any one of the above.

BRIEF DESCRIPTION OF THE DRAWINGS

It should be understood that the above general description and the following detailed description are exemplary and explanatory only and are not intended to limit the present disclosure.

The drawings herein are incorporated into and form part of the description, illustrate embodiments consistent with the disclosure, and together with the description serve to explain the principles of the disclosure. It will be apparent that the drawings in the following description are merely some embodiments of the present disclosure, and other drawings may be obtained from these drawings without creative work by those of ordinary skill in the art.

DETAILED DESCRIPTION

Figure 1:
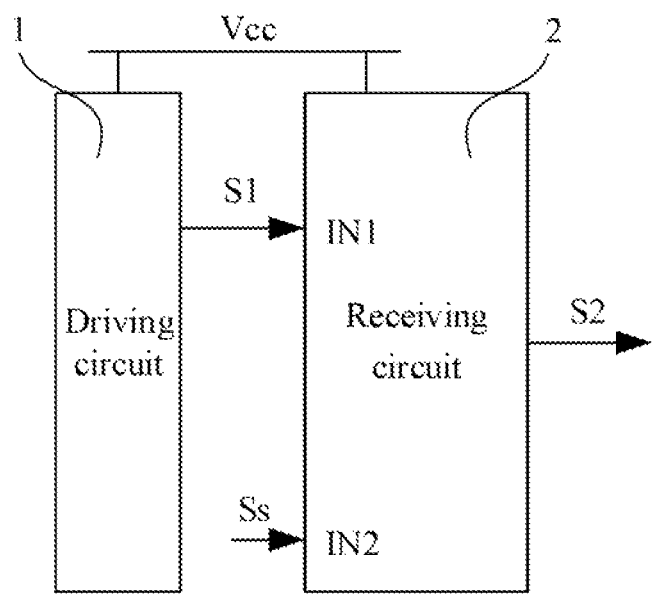
FIG. 1 is a schematic diagram of a structure of a voltage conversion circuit in embodiments of the present disclosure.

Embodiments will now be described more fully with reference to the drawings. However, the embodiments can be implemented in a variety of forms, and should not be construed as limited to the examples set forth herein. Rather, these embodiments are provided so that the present disclosure will be more comprehensive and complete, and the concept of example embodiments will be fully communicated to those skilled in the art. The described features, structures or characteristics may be incorporated in one or more embodiments in any suitable manner. In the following description, many specific details are provided to give a full understanding of the implementation of the present disclosure. However, those skilled in the art will appreciate that the technical aspects of the present disclosure may be practiced without one or more of the specific details described or using other methods, components, devices, steps and the like may be employed. In other instances, the well-known technical solutions are not illustrated or described in detail to avoid drawing too much attention and obscuring aspects of the present disclosure.

Further, the drawings are merely schematic illustrations of the present disclosure. The same reference numerals in the drawings denote the same or similar parts, and thus repeated descriptions thereof will be omitted. Some of the block diagrams illustrated in the drawings are functional entities and need not necessarily correspond to physically or logically independent entities. The functional entities may be implemented in software form, or in one or more hardware modules or integrated circuits, or in different networks and/or processor devices and/or microcontroller devices.

Embodiments of the present disclosure will be described in detail below with reference to the accompanying drawings.

FIG. 1 is a schematic diagram of a structure of a voltage conversion circuit in embodiments of the present disclosure.

Referring to FIG. 1, the voltage conversion circuit 100 may include a driving circuit 1 and a receiving circuit 2.

The driving circuit 1 is powered by a first voltage Vcc, and outputs a first signal S1 at an output end. A voltage of a high level of the first signal S1 is less than the first voltage Vcc.

The receiving circuit 2 is powered by the first voltage Vcc, receives the first signal S1 at a first input end IN1, and receives a sampling signal Ss at a second input end IN2. The receiving circuit 2 is configured to output a second signal S2 according to the sampling signal Ss, and a voltage of a high level of the second signal S2 is equal to the first voltage Vcc.

Figure 2:
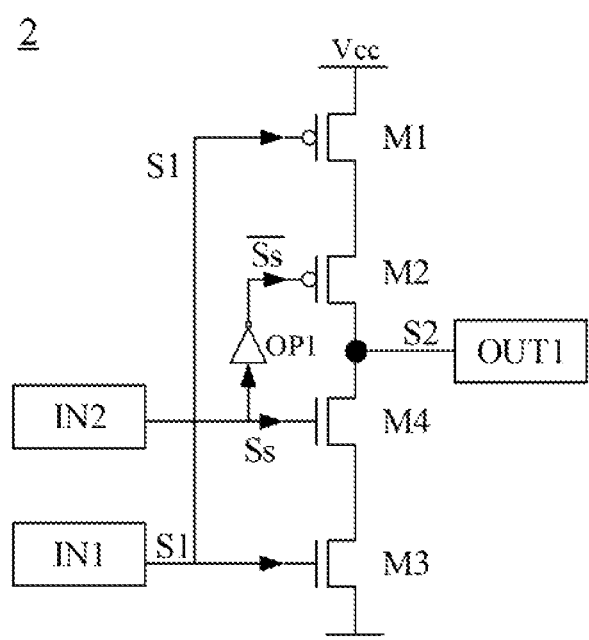
FIG. 2 is a circuit diagram of a receiving circuit 2 in an embodiment of the present disclosure.

FIG. 2 is a circuit diagram of a receiving circuit 2 in an embodiment of the present disclosure.

Referring to FIG. 2, in an embodiment, the receiving circuit 2 may include a first P-type transistor M1, a second P-type transistor M2, a first N-type transistor M3 and a second N-type transistor M4.

A gate of the first P-type transistor M1 is connected to the first input end IN1 and a source of the first P-type transistor M1 is connected to the first voltage Vcc;

a gate of the second P-type transistor M2 is electrically connected to the second input end IN2 through a first inverter OP1, and a source of the second P-type transistor M2 is connected to a drain of the first P-type transistor M1;

a gate of the first N-type transistor M3 is connected to the first input end IN1 and a source of the first N-type transistor M3 is grounded;

a gate of the second N-type transistor M4 is electrically connected to the second input end IN2, a source of the second N-type transistor M4 is connected to a drain of the first N-type transistor M3, a drain of the second N-type transistor M4 is connected to a drain of the second P-type transistor M2; and the drain of the second N-type transistor M4 is an output end OUT1 of the receiving circuit.

The receiving circuit 2 provided by the embodiment of the present disclosure can be realized with fewer elements due to its simple structure, which greatly reduces the occupation area of elements with voltage conversion function and power consumption.

In embodiments of the present disclosure, the receiving circuit 2 operates at a first voltage Vcc. Therefore, the conversion signal (not illustrated, which is output through the drains of the above two transistors) generated by the first P-type transistor M1 and the first N-type transistor M3 based on the first signal S1 is a signal at the first voltage Vcc. The conversion signal is sampled by the second P-type transistor M2 and the second N-type transistor M4, and a second signal S2 whose high level is the first voltage Vcc may be output to raise the voltage of the first signal S1.

In an embodiment of the present disclosure, an enable level of the sampling signal Ss may occur within a preset time in which a level of the first signal S1 is changed. That is, the sampling signal Ss may be triggered by changes in a polarity of the first signal S1, so that the timing of the second signal S2 is consistent with that of the first signal S1.

In another embodiment of the present disclosure, the sampling signal Ss may also be a pulse signal with a set period, so that the aperiodic first signal S1 is converted into a periodic second signal S2, enabling the timing of the signal easier to control. The first signal S1 with different timing sequences may form a group of signals with the same timing sequence through the processing of the sampling signal, which is more beneficial to the use of subsequent circuits.

In an embodiment, the enable level of the sampling signal Ss is a high level, which is equal to the first voltage Vcc. At this time, a gate of the second P-type transistor M2 is connected to the second input end IN2 through a first inverter OP1 (as illustrated in FIG. 2), and a gate of the second N-type transistor M4 is connected to the second input end IN2. In another embodiment, the enable level of the sampling signal Ss is a low level, which may be a zero potential. At this time, a gate of the second P-type transistor M2 is connected to the second input end IN2 (not illustrated), and a gate of the second N-type transistor M4 is connected to the second input end IN2 through the first inverter OP1.

The operating principle of the receiving circuit 2 of the embodiment illustrated in FIG. 2 will be explained below by controlling the timing.

Figure 3:
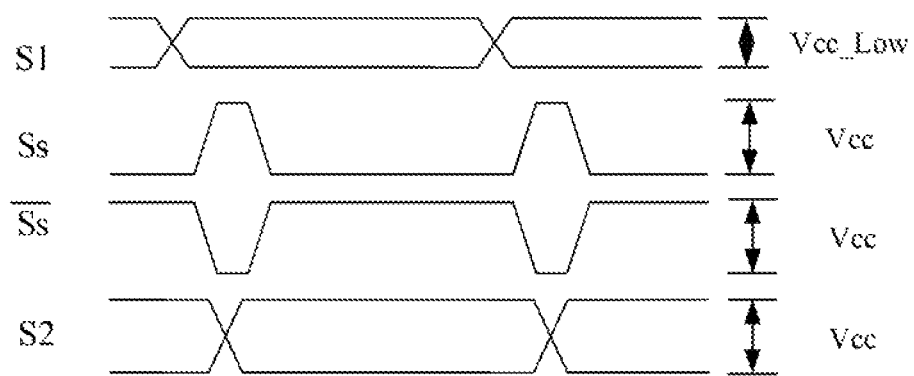
FIG. 3 is a timing control diagram of the receiving circuit 2 in the embodiment illustrated in FIG. 2.

FIG. 3 is a timing control diagram of the receiving circuit 2 in the embodiment illustrated in FIG. 2.

In the embodiment illustrated in FIG. 3, the first signal S1 is a periodic signal, and the sampling signal Ss is also a periodic signal. The sampling signal Ss occurs within a preset time in which a level of the first signal S1 is changed, and the level of the second signal S2 changes with the appearance of the sampling signal Ss. At this time, the level of the first signal S1 ranges from the second voltage Vcc_Low to zero potential (where the second voltage Vcc_Low is smaller than the first voltage Vcc), both the level of the inverted signal obtained after the sampling signal Ss passes through the first inverter OP1 and the level of the second signal S2 range from the first voltage Vcc to zero potential.

FIG. 4A to FIG. 4D are schematic diagrams of equivalent circuits of the receiving circuit 2 illustrated in FIG. 2 under the timing control illustrated in FIG. 3.

Figure 4A:
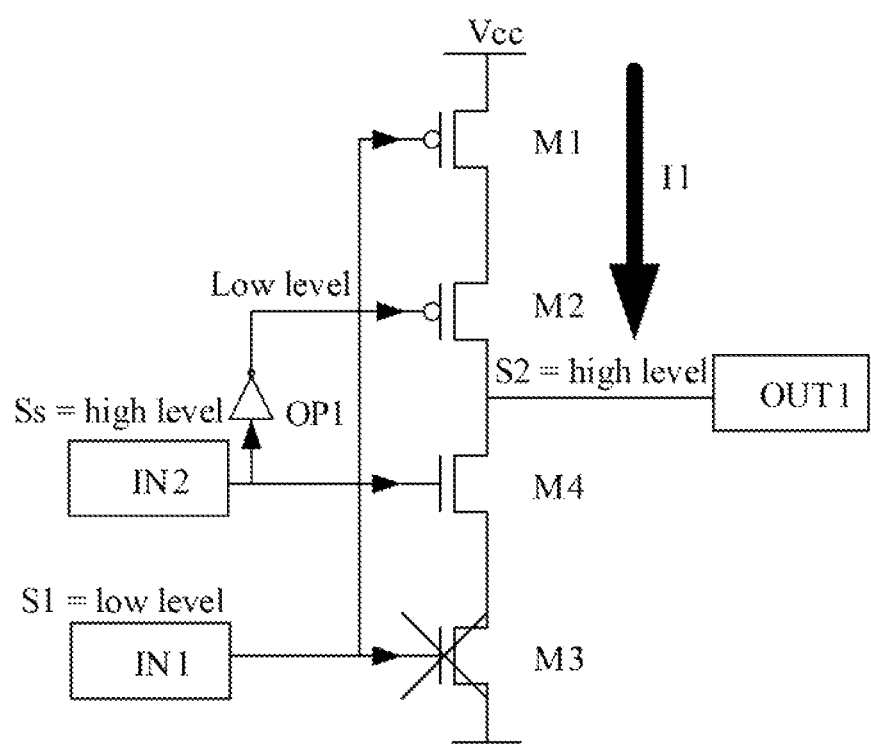
FIG. 4A to FIG. 4D are schematic diagrams of equivalent circuits of the receiving circuit 2 illustrated in FIG. 2 under the timing control illustrated in FIG. 3.

Referring to FIG. 4A, when the first signal S1 is at a low level and the sampling signal Ss is at a high level, the first P-type transistor M1, the second P-type transistor M2, and the second N-type transistor M4 are turned on, and the first N-type transistor M3 is turned off. At this time, the first voltage Vcc is output to the output end OUT1 through the first P-type transistor M1 and the second P-type transistor M2, and a current I1 is generated, so that the second signal S2 is Vcc, that is, a high level.

Figure 4B:
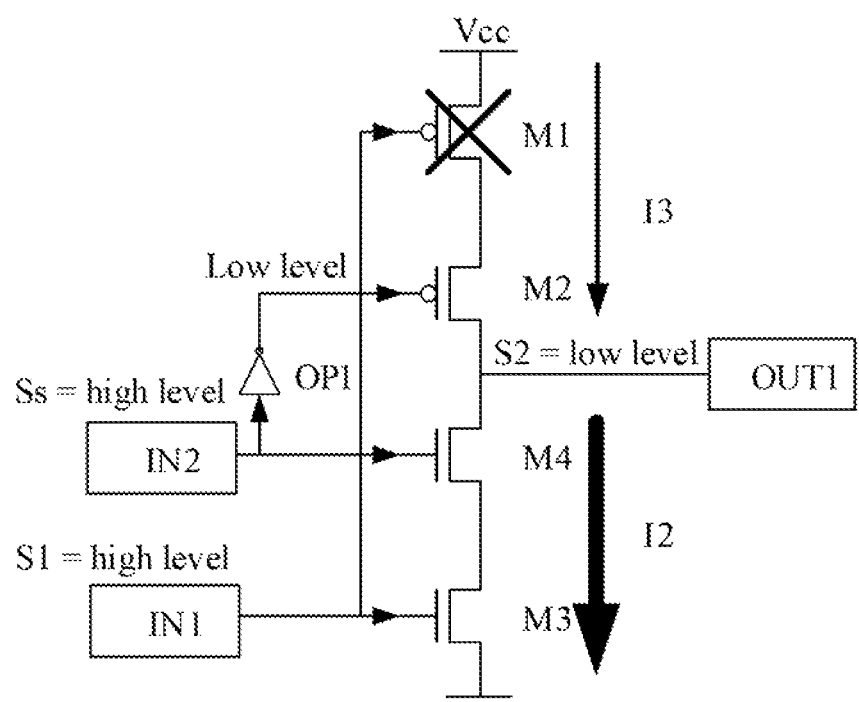

Referring to FIG. 4B, when the first signal S1 is at a high level and the sampling signal Ss is at a high level, the second P-type transistor M2, the first N-type transistor M3 and the second N-type transistor M4 are turned on, and the first P-type transistor M1 is turned off (or at least the pull-up capability of M1 is less than the pull-down capability of M3). At this time, the output end OUT1 is grounded through the first N-type transistor M3 and the second N-type transistor M4, and a discharging current I2 is generated, so that the second signal S2 is 0, that is, a low level. It can be understood that since the high level of the first signal S1 is Vcc_Low, and Vcc_Low is less than Vcc (for example, Vcc_Low is 0.5 V and Vcc is 1.2 V), the first P-type transistor M1 may not be completely turned off, and a certain charging current I3 will exist. The charging current flows from Vcc to the output end OUT1, and the discharging current I2 flows from the output end OUT1 to the ground end.

In order to make the charging current I3 much less than the discharging current I2, so that the second signal S2 of the output end OUT1 reaches 0V, in the embodiment of the present disclosure, the value of the second voltage Vcc_Low needs to make the pull-up capability of the first P-type transistor M1 less than the pull-down capability of the first N-type transistor M3. In an embodiment of the present disclosure, the difference between the first voltage Vcc and the second voltage Vcc_Low for example may be less than or equal to a threshold voltage Vp1 of the first P-type transistor M1, and the value of Vp1 may be 0.5 V for example.

As can be seen from the embodiments illustrated in FIG. 4A and FIG. 4B, the receiving circuit 2 may convert a first signal S1 having a low voltage variation range (Vcc_Low~0) into a second signal S2 having a high voltage variation range (Vcc_Low~0), and the phase of the second signal S2 is opposite to that of the first signal S1.

The phase of the second signal S2 is set, if necessary, to be the same as that of the first signal S1, and an inverter may be connected to the output end OUT1, which is not elaborated in the present disclosure.

Figure 4C:
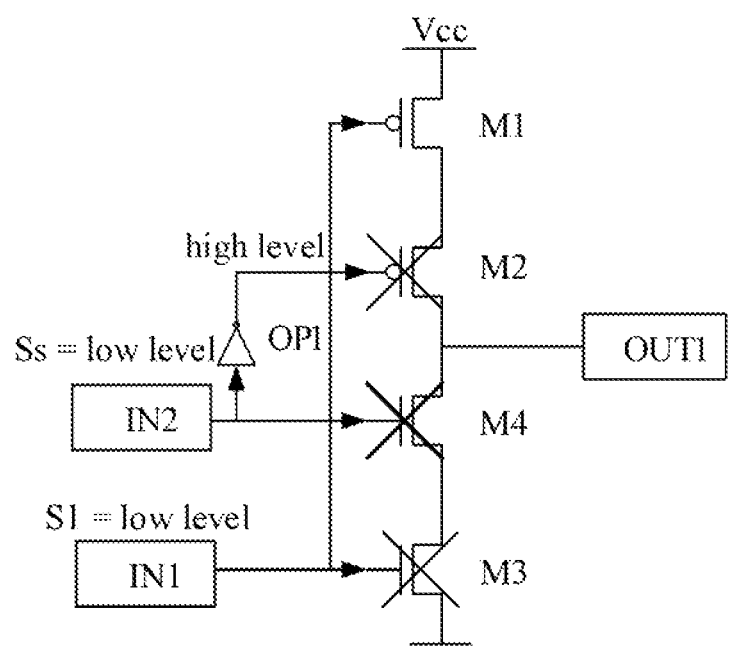
Figure 4D:
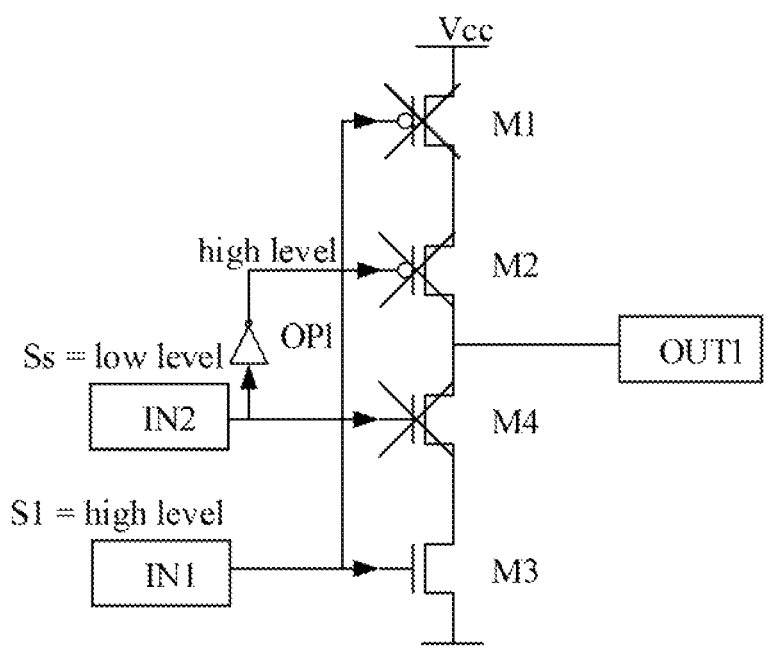

Referring to FIG. 4C and FIG. 4D, when the sampling signal Ss is at a low level, no signal variation occurs at the output end OUT1 regardless of what the first signal S1 is. In order to make the second signal S2 at the output end OUT1 have the same phase as the first signal S1, a manner is to control the sampling signal Ss to be always at a high level. At this time, the second P-type transistor M2 and the second N-type transistor M4 may also be removed. However, this manner will enables to continuously generate a charging current I3 to ground when the first signal S1 is at a high level, resulting in increasing of power consumption of the circuit. Another manner is to connect a latch following the output end OUT1 to keep the output signal of the whole circuit unchanged when the sampling signal Ss is at a low level.

Figure 5:
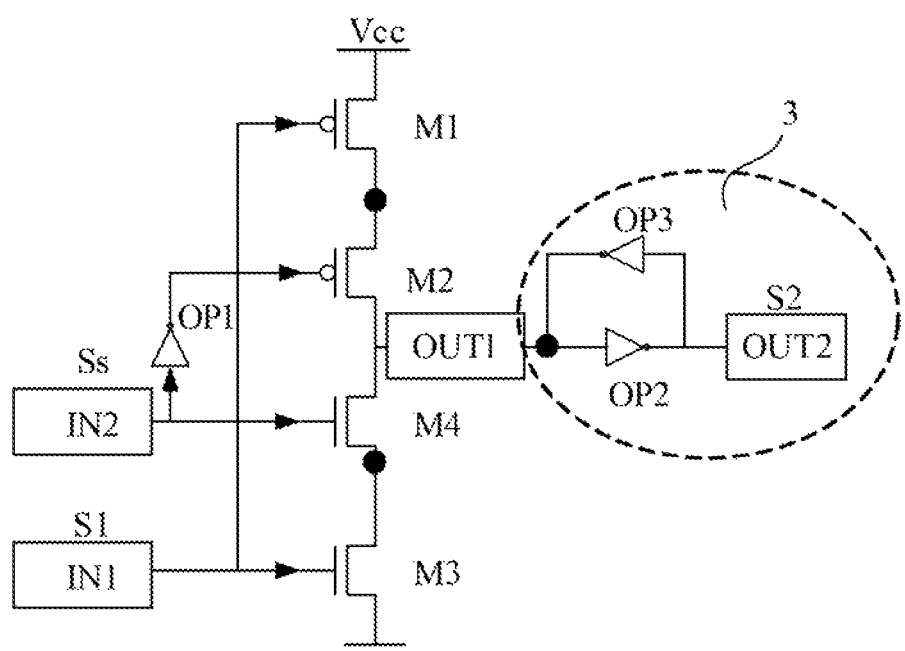
FIG. 5 is a circuit diagram of a latch circuit 3 in an embodiment of the present disclosure.

FIG. 5 is a circuit diagram of a latch circuit in another embodiment of the present disclosure.

Referring to FIG. 5, in another embodiment of the present disclosure, the voltage conversion circuit further includes a latch circuit 3. An input end of the latch circuit 3 receives the second signal S2, and the latch circuit is configured to latch the second signal S2. As illustrated in FIG. 5, in an embodiment, the latch circuit 3 may include a second inverter OP2 and a third inverter OP3.

An input end of the second inverter OP2 is connected to an output end OUT1 of the receiving circuit 2, and an output end of the second inverter OP2 is connected to an output end OUT2 of the latch circuit 3.

An input end of the third inverter OP3 is connected to the output end OUT2 of the latch circuit 3, and an output end of the third inverter OP3 is connected to the input end of the second inverter OP2.

In the embodiment illustrated in FIG. 5, both the second inverter OP2 and the third inverter OP3 are connected with a first voltage Vcc, which is not illustrated in the figure.

FIG. 6A to FIG. 6D are schematic diagrams of equivalent circuits of the circuit illustrated in FIG. 5 under the timing illustrated in FIG. 3.

Figure 6A:
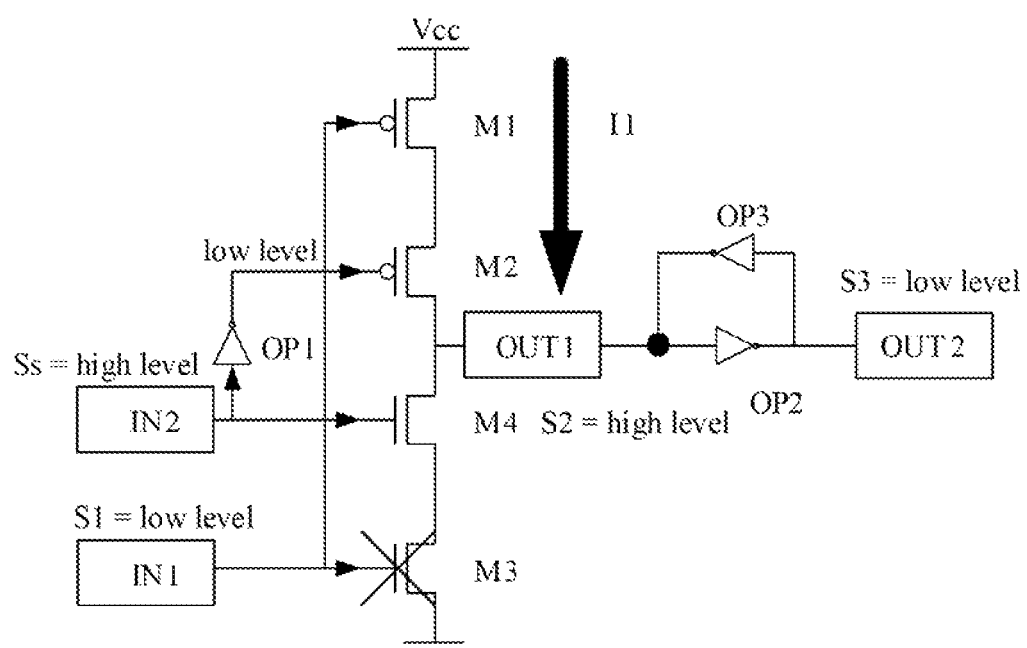
FIG. 6A to FIG. 6D are schematic diagrams of equivalent circuits of the circuit of the embodiment illustrated in FIG. 5 under the timing illustrated in FIG. 3.

Referring to FIG. 6A, when the first signal S1 is at a low level and the sampling signal Ss is at a high level, the first P-type transistor M1, the second P-type transistor M2, and the second N-type transistor M4 are turned on, and the first N-type transistor M3 is turned off (or at least the pull-up capability of M1 is less than the pull-down capability of M3). At this time, the first voltage Vcc is output to the output end OUT1 of the receiving circuit 2 through the first P-type transistor M1 and the second P-type transistor M2, and a current I1 is generated, so that the second signal S2 is Vcc, that is, a high level.

The second signal S2 enters the second inverter OP2 and outputs a low level third signal S3 through the output end OUT2, and the phase of the third signal S3 is synchronized with the phase of the sampling signal Ss. The third signal S3 output from the output end OUT2 is returned to the output end OUT1 via the third inverter OP3, and is still at a high level. In this case, since there is no need for the third inverter OP3 to operate at this time to maintain the voltage of the second signal S2, the third inverter OP3 may be controlled to be in a closed state in order to reduce power consumption.

Figure 6B:
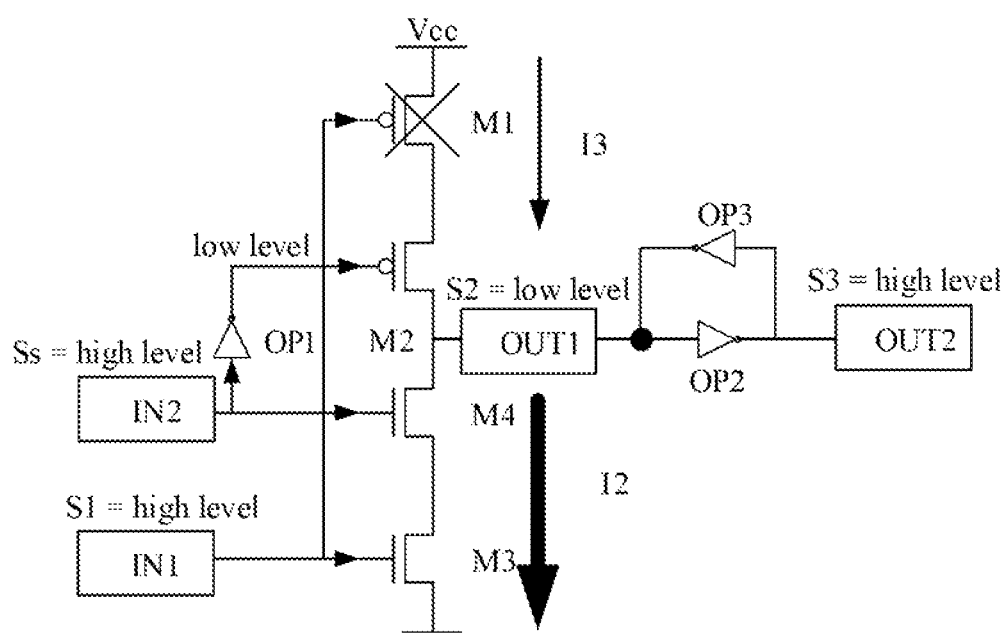

Referring to FIG. 6B, when the first signal S1 is at a high level and the sampling signal Ss is at a high level, the second P-type transistor M2, the first N-type transistor M3 and the second N-type transistor M4 are turned on, and the first P-type transistor M1 is turned off. At this time, the drain of the second N-type transistor M4 is grounded through the first N-type transistor M3 and the second N-type transistor M4, and a discharging current I2 is generated, so that the second signal S2 is 0, that is, a low level. It can be understood that since the high level of the first signal S1 is Vcc_Low, the first P-type transistor M1 will not be completely turned off, and a certain charging current I3 will exist.

The second signal S2 outputs a high level third signal S3 through the second inverter OP2 and through the output end OUT2, and the phase of the third signal S3 is synchronized with the phase of the sampling signal Ss. The third signal S3 is returned to the output end OUT1 via the third inverter OP3, and is still at a low level. In this case, since there is no need for the third inverter OP3 to operate at this time to maintain the voltage of the third signal S3, the third inverter OP3 may be controlled to be in a closed state in order to reduce power consumption. That is, when the sampling signal Ss is in the enabled state, the third inverter OP3 may be set to be in the closed state.

Figure 6C:
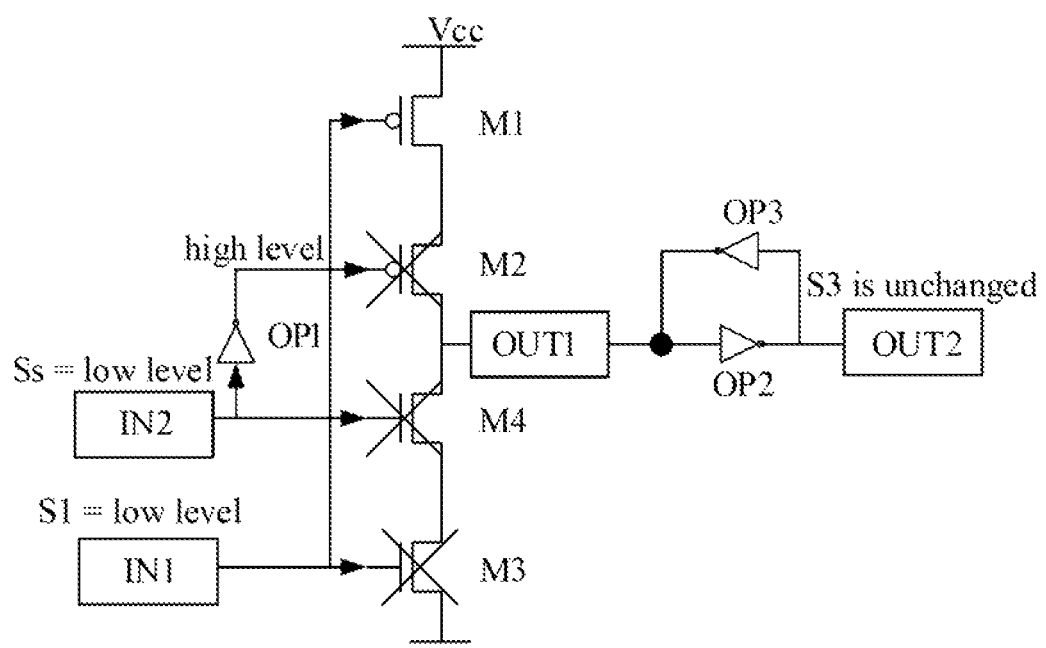
Figure 6D:
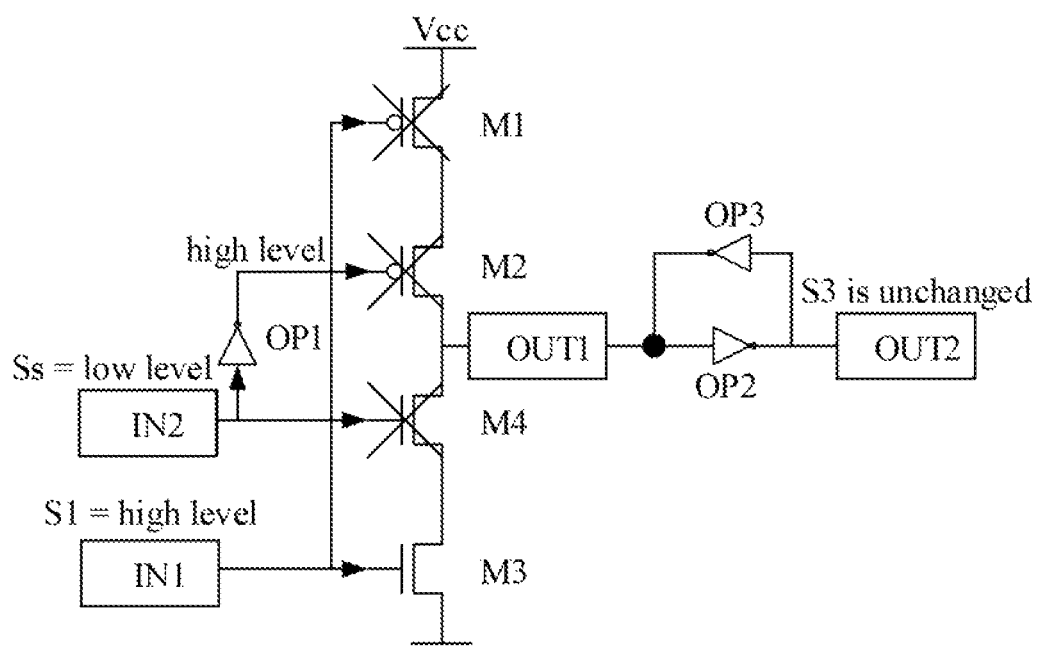

Referring to FIG. 6C, when the sampling signal Ss is at a low level, no signal variation occurs at the output end OUT1 regardless of what the first signal S1 is. Before this state is formed, that is, before the sampling signal Ss is controlled to be at a low level, the third inverter OP3 may be enabled to form a feedback path between the output end OUT1 and the output end OUT2. Since both the second inverter OP2 and the third inverter OP3 are active devices, the latch circuit 3 may maintain, during operation, the voltage of the output end OUT1 and thereby maintain the voltage of the output end OUT2 unchanged. The same applies to the embodiment illustrated in FIG. 6D and the present disclosure is not repeated herein.

When the sampling signal Ss is in an enabled state and the first signal S1 is at a high level, a charging current I3 is generated, resulting in increasing of the power consumption. When the output signal is maintained unchanged by using the latch circuit 3, the maintenance time of the enabled state of the sampling signal Ss may be shortened as much as possible to reduce power consumption of the circuit.

In an embodiment of the present disclosure, when the enable level of the sampling signal Ss occurs within a preset time in which the level of the first signal S1 is changed, the enable level of the sampling signal Ss may for example be maintained for less than half of the time for which the first signal S1 is high level.

In another embodiment of the present disclosure, when the sampling signal Ss is a pulse signal with a set period, a duty cycle of the enable level of the sampling signal Ss may be for example less than ½. To further reduce power consumption, the duty cycle of the sampling signal Ss may be lower, for example less than ¼, less than ¹⁄₁₀, or less than ¹⁄₂₀.

The above values are only examples. In practical applications, those skilled in the art can set the maintenance time of the enable level of the sampling signal Ss according to the actual situation.

Further, the charging current I3 may also be reduced by reducing the sizes of the second P-type transistor M2 and the second N-type transistor M4.

Figure 7:
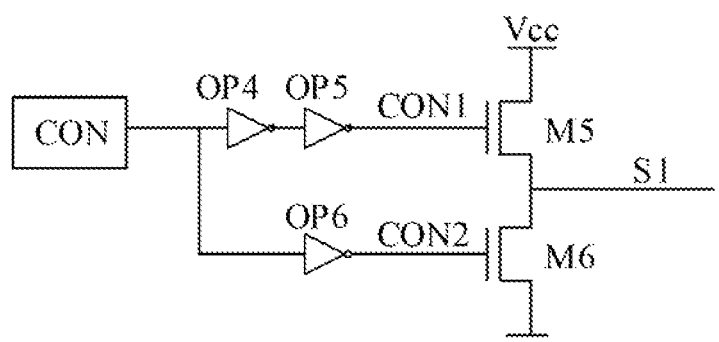
FIG. 7 is a circuit diagram of a driving circuit in an embodiment of the present disclosure.

FIG. 7 is a circuit diagram of a driving circuit in an embodiment of the present disclosure.

Referring to FIG. 7, in an embodiment of the present disclosure, the driving circuit 1 may include a third N-type transistor M5 and a fourth N-type transistor M6.

A drain of the third N-type transistor M5 is connected to the first voltage Vcc, a source of the third N-type transistor M5 is connected to a drain of the fourth N-type transistor M6, a source of the fourth N-type transistor M6 is grounded, and the drain of the fourth N-type transistor M6 is served as the output of the driving circuit 1 and is connected to the first input end IN1 of the receiving circuit 2. In an embodiment of the present disclosure, the third N-type transistor M5 has the same size as the fourth N-type transistor M6.

In an embodiment of the present disclosure, the third N-type transistor M5 may receive a first control signal CON1 at a gate thereof and the fourth N-type transistor M6 receives a second control signal CON2 at a gate thereof, and the first control signal CON1 has an opposite phase to the second control signal CON2.

In the embodiment illustrated in FIG. 7, both the first control signal CON1 and the second control signal CON2 are generated by the control signal output from the control port CON. A fourth inverter OP4 and a fifth inverter OP5 are provided between the control port CON and the gate of the third N-type transistor M5, and a sixth inverter OP6 is provided between the control port CON and the gate of the fourth N-type transistor M6, so that the first control signal CON1 has a phase opposite to the second control signal CON2. In other embodiments, an inverter may be provided between the control port CON and the gate of the third N-type transistor M5, and two inverters may be provided between the control port CON and the gate of the fourth N-type transistor M6 for the same purpose. Alternatively, in other embodiments of the present disclosure, complete inversion between the phase of the first control signal CON1 and the phase of the second control signal CON2 may be achieved by other manners, and is not particularly limited by the present disclosure.

As illustrated in the driving circuit 1 of FIG. 7, when the control signal of the control port CON is at a high level, the third N-type transistor M5 is turned on and the fourth N-type transistor M6 is turned off, and a voltage Vcc minus VthN (Vcc−VthN) may be output through the source of the third N-type transistor M5, where VthN is the threshold voltage of the third N-type transistor M5 and is greater than zero. When the control signal of the control port CON is at a low level, the third N-type transistor M5 is turned off and the fourth N-type transistor M6 is turned on, so that a low voltage (zero potential) may be output through the drain of the fourth N-type transistor M6. Further, the driving circuit 1 may output a first signal S1 having a high level of Vcc−VthN and a low level of zero potential according to a change in the control signal of the control port CON.

Compared with the related art of outputting high level through CMOS structure, the embodiment illustrated in FIG. 7 can reduce the overall power consumption of the circuit by outputting high level through NMOS (i.e., changing the pull-up transistor from PMOS to NMOS).

Figure 8:
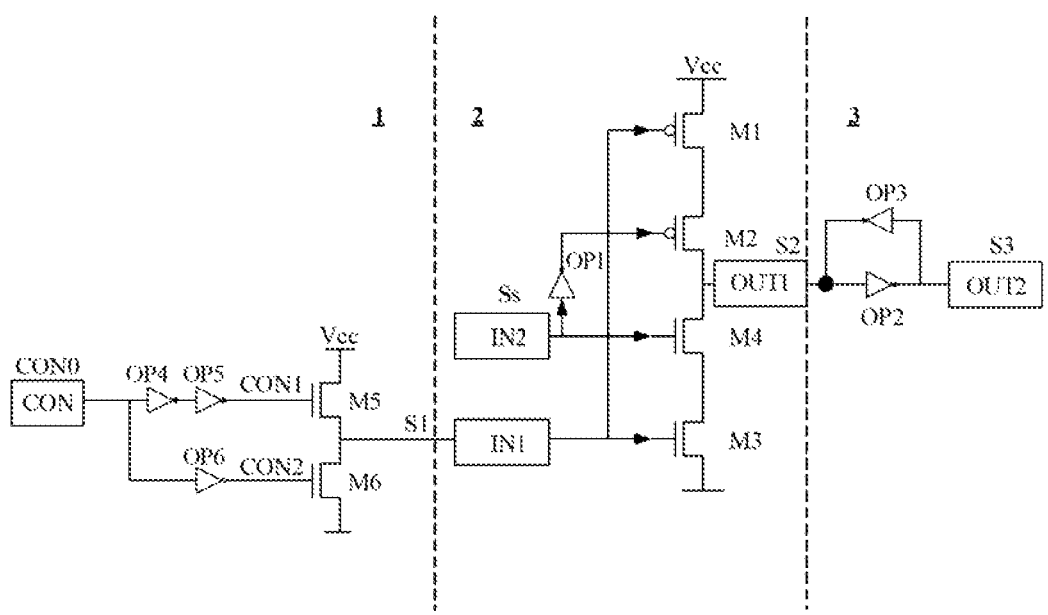
FIG. 8 is a schematic diagram of an overall circuit of a voltage conversion circuit in an embodiment of the present disclosure.

FIG. 8 is a schematic diagram of an overall circuit of the voltage conversion circuit in an embodiment of the present disclosure.

Referring to FIG. 8, since the driving circuit 1 outputs a high level through the N-type transistor, the overall power consumption of the driving circuit 1 can be reduced and the output high level is smaller than the first voltage Vcc. In the embodiment of the present disclosure, the receiving circuit 2 illustrated in FIG. 2 or FIG. 5 is connected following the driving circuit 1, and a second signal S2 at a high level of Vcc and a low level of zero potential can be generated according to the first signal S1.

In the embodiment of the circuit illustrated in FIG. 8, the sampling signal Ss may be set to output a sampling level in the enabled state after a preset time for the level conversion of the control signal CON0 input to the control port CON, and the duration of the sampling level is as short as possible, so that the first signal S1 generated according to the first control signal CON1 and the second control signal CON2 may be sampled by the sampling signal Ss to output a third signal S3 through the output end OUT2. The third signal S3 has a fixed delay and the same level direction as the control signal CON0 and has a high level of Vcc and a low level of zero level.

Because the receiving circuit 2 has simple structure and low power consumption, compared with the related art, the voltage conversion circuit provided by the embodiment of the present disclosure can realize the output of signals whose high level is Vcc and low level is zero potential through simple structure and low power consumption, and greatly reduces the occupation area and volume of elements in the voltage conversion circuit.

According to a second aspect of the present disclosure, there is provided a memory including a voltage conversion circuit as described in any one of the embodiments. As can be seen from the above description, the memory provided with the voltage conversion circuit provided by the embodiments of the present disclosure can have lower power consumption and a smaller occupation area of elements, and the present disclosure will not be repeated herein.

In the embodiments of the present disclosure, an N-type transistor powered by a first voltage is used to output a first signal, and a receiving circuit is used to convert the first signal to generate a second signal having a high level voltage equal to the first voltage, thereby reducing the overall power consumption of the circuit when outputting the second signal. In addition, by sampling a first signal with a lower voltage using a sampling signal in a receiving circuit to output a second signal, the first signal with a lower voltage can be converted into an output signal with a higher voltage using a small number of elements, thereby reducing the occupation area of elements and power consumption of elements in the voltage conversion process.

It should be noted that although several modules or units of the device for action execution are mentioned in the above detailed description, this division is not mandatory. Indeed, according to embodiments of the present disclosure, the features and functions of the two or more modules or units described above may be embodied in one module or unit. Conversely, the features and functions of a module or a unit described above may be further partitioned into a plurality of modules or units to be embodied.

Other embodiments of the present disclosure will readily be contemplated by those skilled in the art after considering the description and practicing the invention disclosed herein. The present disclosure is intended to cover any variations, uses, or adaptations of the present disclosure that follow the general principles of the present disclosure and include well-known common knowledge or conventional technical means in the art not disclosed in the present disclosure. The description and embodiments are only considered exemplary, and the true scope and spirit of the present disclosure is indicated by the appended claims.

INDUSTRIAL APPLICABILITY

In embodiments of the present disclosure, an N-type transistor powered by a first voltage is used to output a first signal, and a receiving circuit is used to convert the first signal to generate a second signal having a high level voltage equal to the first voltage, thereby reducing the overall power consumption of the circuit when outputting the second signal. In addition, by sampling a first signal with a lower voltage using a sampling signal in a receiving circuit to output a second signal, the first signal with a lower voltage can be converted into an output signal with a higher voltage using a small number of elements, thereby reducing the occupation area of elements and power consumption of elements in the voltage conversion process.

The invention claimed is:

1. A voltage conversion circuit, comprising:
   a driving circuit, powered by a first voltage, and outputting a first signal at an output end, a voltage of a high level of the first signal being less than the first voltage; and
   a receiving circuit, powered by the first voltage, receiving the first signal at a first input end, and receiving a sampling signal at a second input end, wherein the receiving circuit is configured to output a second signal according to the sampling signal, and a voltage of a high level of the second signal is equal to the first voltage;
   wherein the receiving circuit comprises:
   a first P-type transistor, a gate of the first P-type transistor being connected to the first input end and a source of the first P-type transistor being connected to the first voltage;
   a second P-type transistor, a gate of the second P-type transistor being electrically connected to the second input end through a first inverter, and a source of the second P-type transistor being connected to a drain of the first P-type transistor;
   a first N-type transistor, a gate of the first N-type transistor being connected to the first input end and a source of the first N-type transistor being grounded; and
   a second N-type transistor, a gate of the second N-type transistor being electrically connected to the second input end, a source of the second N-type transistor being connected to a drain of the first N-type transistor, and a drain of the second N-type transistor being connected to a drain of the second P-type transistor;
   wherein the drain of the second N-type transistor is an output end of the receiving circuit.

2. The voltage conversion circuit of claim 1, further comprising:
   a latch circuit, an input end of the latch circuit receiving the second signal, and the latch circuit being configured to latch the second signal.

3. The voltage conversion circuit of claim 2, wherein the latch circuit comprises:
   a second inverter, an input end of the second inverter being connected to an output end of the receiving circuit, and an output end of the second inverter being connected to an output end of the latch circuit; and
   a third inverter, an input end of the third inverter being connected to the output end of the latch circuit, and an output end of the third inverter being connected to the input end of the second inverter.

4. The voltage conversion circuit of claim 3, wherein the third inverter is in a closed state in response to that the sampling signal is in an enabled state.

5. The voltage conversion circuit of claim 1, wherein an enable level of the sampling signal occurs within a preset time in which a level of the first signal is changed.

6. The voltage conversion circuit of claim 5, wherein the enable level of the sampling signal is maintained for less than half of time for which the first signal is at a high level.

7. The voltage conversion circuit of claim 1, wherein the sampling signal is a pulse signal with a set period.

8. The voltage conversion circuit of claim 7, wherein a duty cycle of an enable level of the sampling signal is less than ½.

9. The voltage conversion circuit of claim 1, wherein the voltage of the high level of the first signal causes a pull-up capability of the first P-type transistor to be greater than a pull-down capability of the first N-type transistor.

10. The voltage conversion circuit of claim 1, wherein a difference between the first voltage and the voltage of the high level of the first signal is less than or equal to a threshold voltage of the first P-type transistor.

11. The voltage conversion circuit of claim 1, wherein the driving circuit comprises:
    a third N-type transistor and a fourth N-type transistor, a drain of the third N-type transistor being connected to the first voltage, a source of the third N-type transistor being connected to a drain of the fourth N-type transistor, a source of the fourth N-type transistor being grounded, and the drain of the fourth N-type transistor being served as the output end of the driving circuit.

12. The voltage conversion circuit of claim 11, wherein the third N-type transistor receives a first control signal at a gate and the fourth N-type transistor receives a second control signal at a gate, the first control signal having an opposite phase to the second control signal.

13. The voltage conversion circuit of claim 12, wherein the third N-type transistor has a same size as the fourth N-type transistor.

14. A memory, comprising the voltage conversion circuit of claim 1.

15. A voltage conversion circuit, comprising:
    a driving circuit, powered by a first voltage, and outputting a first signal at an output end, a voltage of a high level of the first signal being less than the first voltage; and
    a receiving circuit, powered by the first voltage, receiving the first signal at a first input end, and receiving a sampling signal at a second input end, wherein the receiving circuit is configured to output a second signal according to the sampling signal, and a voltage of a high level of the second signal is equal to the first voltage;
    wherein the driving circuit comprises:
    a first N-type transistor and a second N-type transistor, a drain of the first N-type transistor being directly connected to the first voltage, a source of the first N-type transistor being connected to a drain of the second N-type transistor, a source of the second N-type transistor being grounded, and the drain of the second N-type transistor being served as the output end of the driving circuit.

16. The voltage conversion circuit of claim 15, wherein the first N-type transistor receives a first control signal at a gate and the second N-type transistor receives a second control signal at a gate, the first control signal having an opposite phase to the second control signal.

17. The voltage conversion circuit of claim 16, wherein the first N-type transistor has a same size as the second N-type transistor.

18. A memory, comprising the voltage conversion circuit of claim 15.

\* \* \* \* \*